United States Patent
Kurogane et al.

[11] Patent Number: 6,040,206
[45] Date of Patent: Mar. 21, 2000

[54] THIN FILM TRANSISTOR

[75] Inventors: Saori Kurogane, Higashiosaka; Hiromi Sakamoto, Kashiba, both of Japan

[73] Assignee: Sharp Kabushiki Kaisha, Osaka, Japan

[21] Appl. No.: 09/146,428

[22] Filed: Sep. 3, 1998

Related U.S. Application Data

[62] Division of application No. 08/757,765, Nov. 27, 1996, Pat. No. 5,831,281.

[30] Foreign Application Priority Data

Nov. 28, 1995 [JP] Japan ................................. 7-309614

[51] Int. Cl.$^7$ ................................................. H01L 21/339
[52] U.S. Cl. ......................... 438/149; 438/233; 438/656
[58] Field of Search .......................... 257/763, 66, 59, 257/57; 438/643, 523

[56] References Cited

U.S. PATENT DOCUMENTS

| | | | |
|---|---|---|---|
| 4,161,430 | 7/1979 | Sogo | 205/124 |
| 4,684,536 | 8/1987 | Zega | 204/192 |
| 4,884,123 | 11/1989 | Dixit et al. | 257/751 |
| 5,264,071 | 11/1993 | Anthony et al. | 117/3 |
| 5,296,653 | 3/1994 | Kiyota et al. | 174/250 |
| 5,356,659 | 10/1994 | Seshubabu et al. . | |
| 5,367,179 | 11/1994 | Mori et al. | 257/59 |
| 5,604,360 | 2/1997 | Zhang et al. | 257/72 |
| 5,811,835 | 9/1998 | Seiki et al. | 257/57 |

OTHER PUBLICATIONS

Y. Ozaki et al., Japanese Laid–Open Patent Publication No. 6–104241, Laid Open on Apr. 15, 1994, with partial English translation.

*Primary Examiner*—Joni Chang
*Assistant Examiner*—William David Coleman
*Attorney, Agent, or Firm*—Nixon & Vanderhye P.C.

[57] ABSTRACT

A thin film transistor of this invention includes: a source and drain regions formed on an insulating base region; and a conductive layer connected to the source and drain regions. The conductive layer has a layered structure of an Al-containing metal film and an N-containing Mo film.

19 Claims, 8 Drawing Sheets

*FIG.2A*
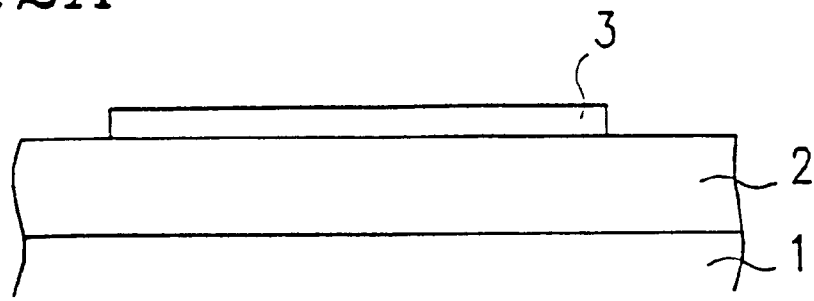
*FIG.2B*
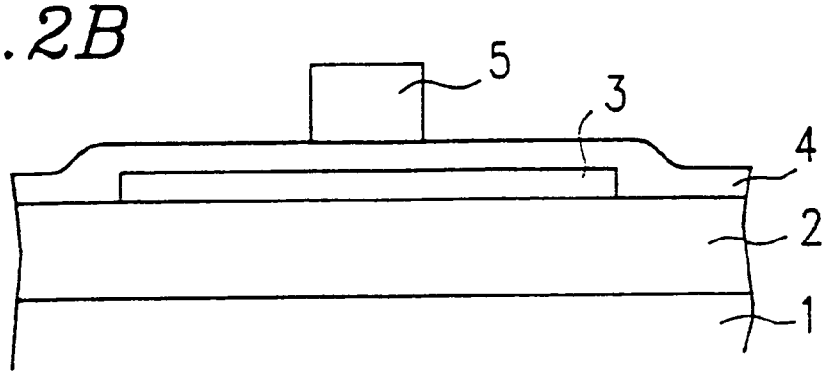
*FIG.2C* Laser irradiation after ion-implantation
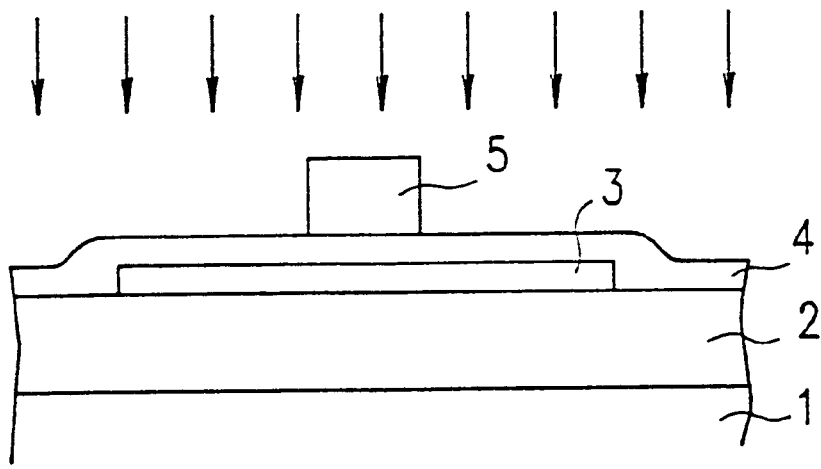

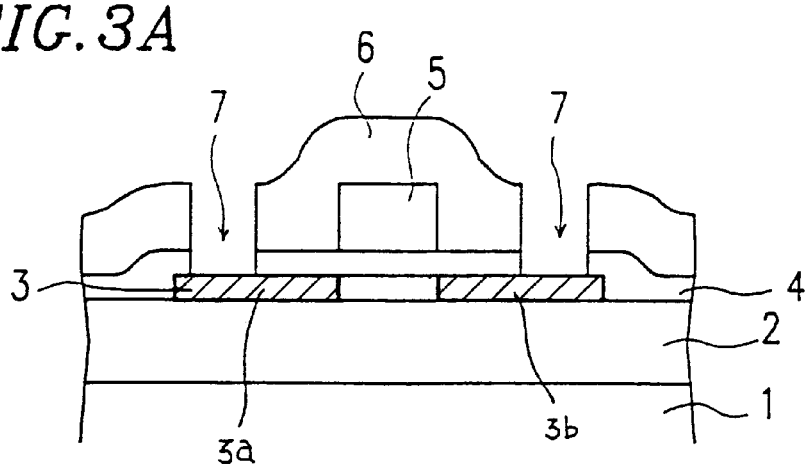
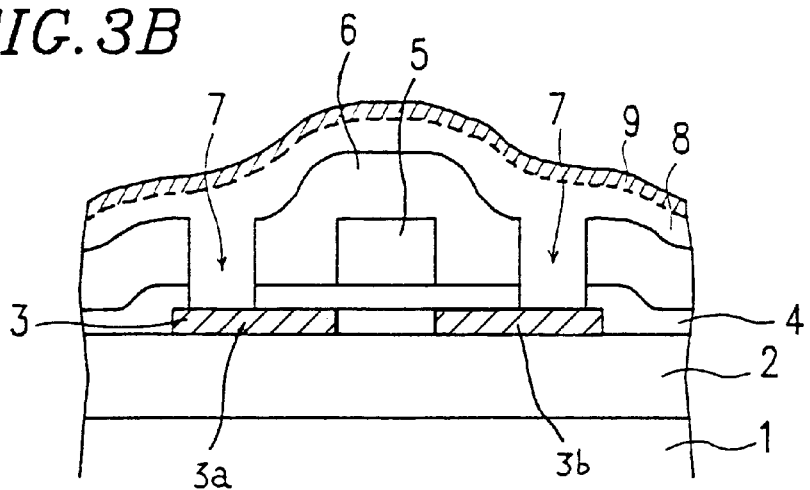
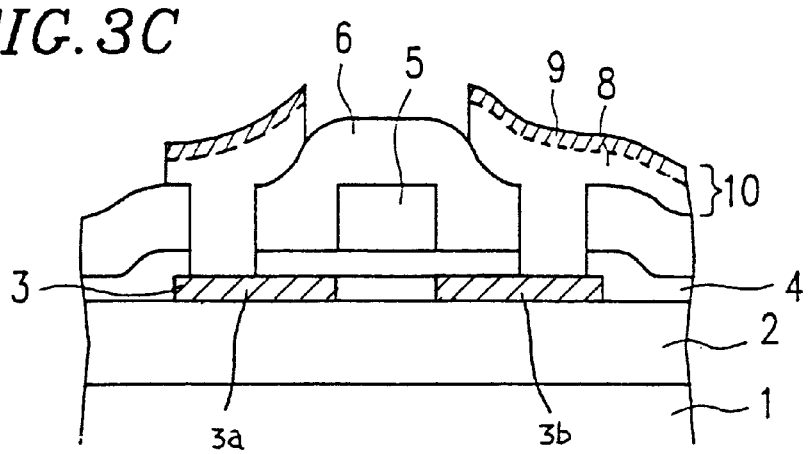

FIG.5A
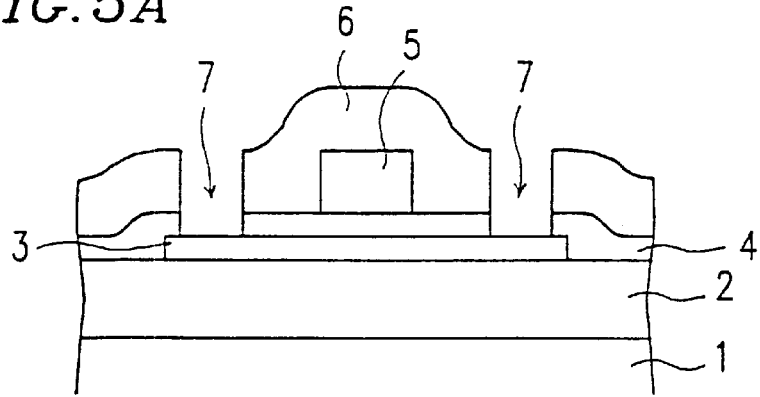
FIG.5B
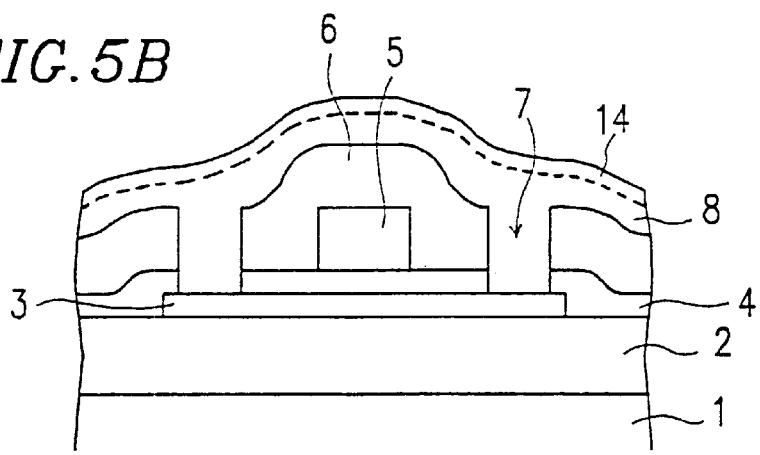
FIG.5C Ion-implantation
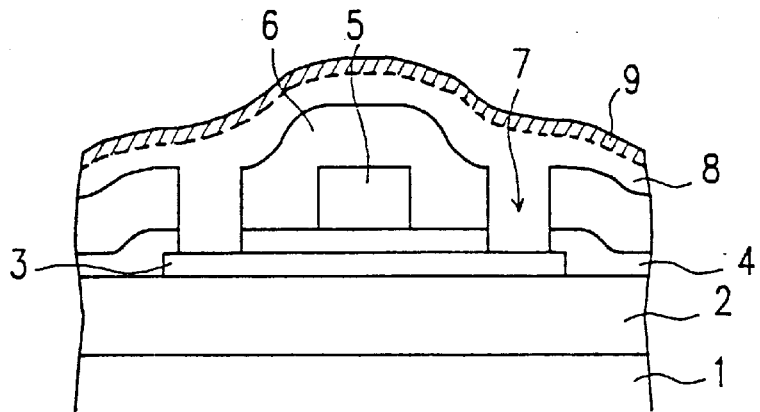

THIN FILM TRANSISTOR

This is a divisional of application Ser. No. 08/757,765, filed Nov. 27, 1996, now U.S. Pat. No. 5,831,281.

BACKGROUND OF THE INVENTION

1. Field of the Invention

The present invention relates to a thin film transistor (hereinafter referred to simply as a "TFT") and a method for fabricating the same. In particular, the present invention relates to the structure and the fabrication process of the TFTs used as switching elements for selecting a pixel in a liquid crystal display device (hereinafter referred to simply as an "LCD") or as driver elements for driving the LCD.

2. Description of the Related Art

An active matrix substrate in an LCD is provided with a plurality of TFTs arranged in a matrix, a plurality of pixel electrodes made of an ITO (indium tin oxide) film each corresponding to one of the TFTs, and a conductive layer connected to source and drain regions. As the conductive layer including source and drain electrodes, and source and drain lines (hereinafter referred to as the "source/drain electrode lines"), an Al (aluminum) thin film is used.

The Al film is patterned using a resist so as to serve as the source/drain electrode lines in the substrate having the above-described configuration. When the resist is developed with a developing solution, however, the developing solution causes a cell reaction between the Al film and the ITO film, thereby causing corrosion of the Al film.

The corrosion can be prevented, for example, as follows. An insulating film is deposited on the source/drain electrode lines formed by patterning the Al film. A contact hole is provided through the depth of the insulating film so as to electrically connect the source/drain electrode lines to the pixel electrodes located above the electrode lines. The ITO film is then deposited over the insulating film. During the deposition of the ITO film, however, portions of the Al film exposed via the contact hole running through the insulating film is oxidized by an oxygen atmosphere in a deposition apparatus. As a result, there arises a problem that an ohmic contact cannot be obtained between the ITO film and the source/drain electrode lines.

In order to solve the above-mentioned problems, the source/drain electrode lines can be a double layer including an Al film and an Mo (molybdenum) film deposited on the Al film. In such a case, the corrosion can be prevented, while it is possible to obtain an ohmic contact between the ITO film and the source/drain electrode lines.

Moreover, in the case where the source/drain electrode lines have the Mo/Al double layer structure, where the Mo film is deposited on the Al film, it is possible to suppress the occurrence of Al bumps, i.e., hillocks or whiskers, which prevents the migration of the Al film, and thus enhances the reliability of the lines.

In the case where the source/drain electrode lines have the Mo/Al double layer structure, the two layers can be successively deposited. Moreover, the two layers can be simultaneously wet-etched using a mixed solution containing phosphoric acid, nitric acid, acetic acid, and $H_2O$. It is thus possible to solve problems such as corrosion without increasing the number of the processing steps.

However, since the etching rates of the Al film and the Mo film are different from each other, there arises a problem that the pattern of the Mo film shifts with respect to the pattern of the Al film as a result of the wet-etching. In other words, the line width of the pattern of the Mo film or the Al film becomes smaller than that of the other.

For example, as a result of the wet etching, a lower layer film 21 of the source/drain electrode lines may be etched more in the lateral direction than an upper layer film 22 thereof, as shown in FIG. 6A. When another film 23 (e.g., an insulating film or a protective film) is formed over such source/drain electrode lines, a cavity 24 may be generated, which may then develop to be a crack 25, in the vicinity of the interface between the lower layer 21 and the upper layer 22 of the source/drain electrode lines. In subsequent processing steps, an acid or the like may permeate into the cavity 24 or the crack 25, and cause corrosion in the source/drain electrode lines. Thus, there arises a problem such as disconnection of the lines.

Conversely, as a result of the wet etching, the upper layer film 22 of the source/drain electrode lines may be etched more in the lateral direction than the layer film 21 thereof. As a result, the line width of the pattern of the upper layer 22 becomes smaller than that of the lower layer 21, as shown in FIG. 6B. In such a case, the coverage of an ITO film 26 over a contact hole 23a provided above the source/drain electrode lines is incomplete. Accordingly, the contact resistance thereof is high, whereby it is difficult to obtain electric conductivity between the ITO film 26 and the source/drain electrode lines.

As shown in FIG. 6B, the lower layer film 21 of the source/drain electrode lines may be exposed in the contact hole 23a provided above the source/drain electrode lines. In such a case, when a mask pattern is dislocated in a mask alignment process for etching the ITO film 26, a portion 27 of the source/drain electrode lines is corroded by, for example, an etching solution for etching the ITO film 26 or other acids used in subsequent processing steps.

Also, in view of the reliability (i.e., the structural strength) of the Al film of the Mo/Al double layer structure of the source/drain electrode lines, when the etching shift of the Al film lower layer 21 is large, arises a problem that the coverage of the film covering the source/drain electrode lines is likely to be deteriorated. On the other hand, when the etching shift of the Mo film upper layer 22 of the Mo/Al double layer structure is large, there arises a problem that the anti-hillock property or the like, in a heat-treatment for the Al film, is deteriorated.

Japanese Laid-Open Patent Publication No. 6-104241 discloses a method for etching a double layer structure where a thickness ratio of layered films is controlled to reduce the amount of side etching. Based on experiments conducted by the inventors of the present invention, it is confirmed that, in the case of the Mo/Al double layer structure, the line width of the Mo film becomes smaller than that of the Al film regardless of the thickness ratio thereof.

SUMMARY OF THE INVENTION

A thin film transistor of this invention includes: a source and drain regions formed on an insulating base region; and a conductive layer connected to the source and drain regions, wherein the conductive layer a layered structure of an Al-containing metal film and an N-containing Mo film.

In one embodiment of the present invention, the N-containing Mo film has a specific resistance in a range of about 65 to 195 $\mu\Omega$cm.

A thin film transistor of this invention includes the step of forming a double-layered conductive layer of an Al-containing metal film and an N-containing Mo film, the conductive layer being connected to a source and a drain region formed on an insulating base region, wherein the Mo film is deposited in an atmosphere containing an $N_2$ gas or an $NH_3$ gas.

In another embodiment of the present invention, the Mo film is deposited by sputtering in an atmosphere containing a mixed gas of an Ar gas and an $N_2$ gas.

In another embodiment of the present invention, the Mo film is deposited by a CVD method using a gas containing $N_2$ or $NH_3$.

A method for fabricating a thin film transistor the present invention includes, the step of forming a double-layered conductive layer of an Al-containing metal film and an N-containing Mo film, the conductive layer being connected to a source and drain regions formed on an insulating base region, wherein the N-containing Mo film is formed by introducing nitrogen into a film formed by a Mo deposition.

In another embodiment of the present invention, nitrogen is introduced into the film formed by a Mo deposition by annealing the film in an atmosphere containing an $N_2$ gas or an $NH_3$ gas.

In another embodiment of the present invention, nitrogen is introduced into the film formed by a Mo deposition by an ion implantation method.

A double-layer conductive structure of this invention includes: an Al-containing conductive layer, and an N-containing Mo layer coupled to the Al-containing conductive layer, wherein the Al-containing conductive layer and the N-containing Mo layer have substantially the same etching rate.

A method of fabricating a double-layer conductive structure of this invention includes the steps of: forming an Al-containing conductive layer, forming an N-containing Mo layer coupled to the Al-containing conductive layer, and etching the Al-containing conductive layer and the N-containing layer, wherein an etch rate of the Al-containing conductive layer and the N-containing layer are substantially the same.

Hereinafter, the function of the present invention will be described.

According to the present invention, a conductive layer connected to source and drain regions has a double layer structure of an Al-containing metal film and an N (nitrogen)-containing Mo film. In such a case, the etching rate of the Mo film becomes closer to the etching rate of the Al-containing metal film. Thus, the conductive layer of the double layer structure can be etched with the amount of shift of the Mo film with respect to the Al film being minimized.

Thus, the invention described herein makes possible the advantages of (1) providing a TFT where an Mo/Al double layer structure can be etched, thereby forming a conductive layer to serve as source/drain electrode lines with the amount of shift of the Mo film with respect to the Al film being minimized, and (2) providing a method for fabricating the same.

These and other advantages of the present invention will become apparent to those skilled in the art upon reading and understanding the following detailed description with reference to the accompanying figures.

BRIEF DESCRIPTION OF THE DRAWINGS

FIGS. 2A to 2C, 3A to 3C, and 4A and 4B are cross-sectional views illustrating a method of fabricating a TFT according to Examples 1 to 4 of the present invention.

FIGS. 5A to 5C are cross-sectional views illustrating a method of fabricating a TFT according to Example 4 of the present invention.

DESCRIPTION OF THE PREFERRED EMBODIMENTS

First, the basic principles of the present invention will be described.

According to the present invention, an Mo film may be deposited above or beneath an Al-containing metal film by sputtering in a mixed gas containing an Ar (argon) gas and an $N_2$ gas, with the flow rate of $N_2$ gas being about 10 to 70% of that of the Ar gas. Thus, a conductive layer to form source/drain electrode lines is formed.

Alternatively, according to the present invention, an Mo film may be deposited above or beneath an Al-containing metal film by a CVD method in an atmosphere containing an $N_2$ gas or an $NH_3$ gas.

According to the present invention, after an Mo film is deposited above or beneath an Al-containing metal film, nitrogen is introduced into the Mo film through an ion implantation process or an annealing process in an atmosphere containing an $N_2$ gas or an $NH_3$ gas with a process temperature in the range of about 450 to 600° C.

According to these processing methods, an N-containing Mo film having a specific resistance in the range of about 65 to 195 $\mu\Omega$cm can be deposited. Thus, it is possible to minimize the amount by which the Mo film shifts with respect to the Al film as a result of the wet etching process.

Figure 7:
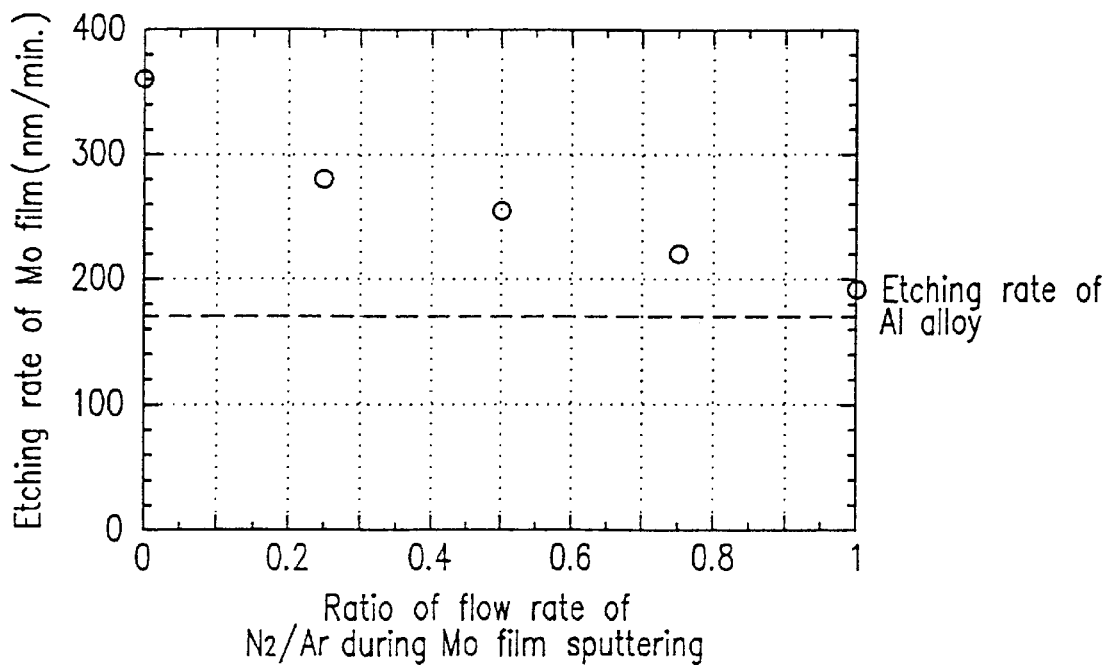
FIG. 7 is a graph showing the relationship between the ratio of flow rate of $N_2/Ar$ during an Mo film sputtering process and the etching rate (nm/min) of the Mo film.

Specifically, as can be seen from FIG. 7, as the ratio of flow rate of $N_2/Ar$ during the Mo film deposition increases, the etching rate of the Mo film decreases, i.e., becoming closer to the etching rate of the Al film. Therefore, it is possible to minimize the amount by which the Mo film shifts with respect to the Al film as a result of the wet etching process.

Hereinafter, variation of the amount by which the Mo film upper layer shifts with respect to the Al alloy metal film lower layer as a result of the wet etching process with respect to the ratio of flow rate of $N_2/Ar$ during the Mo film deposition will be described referring to the graph of FIG. 8.

Figure 8:
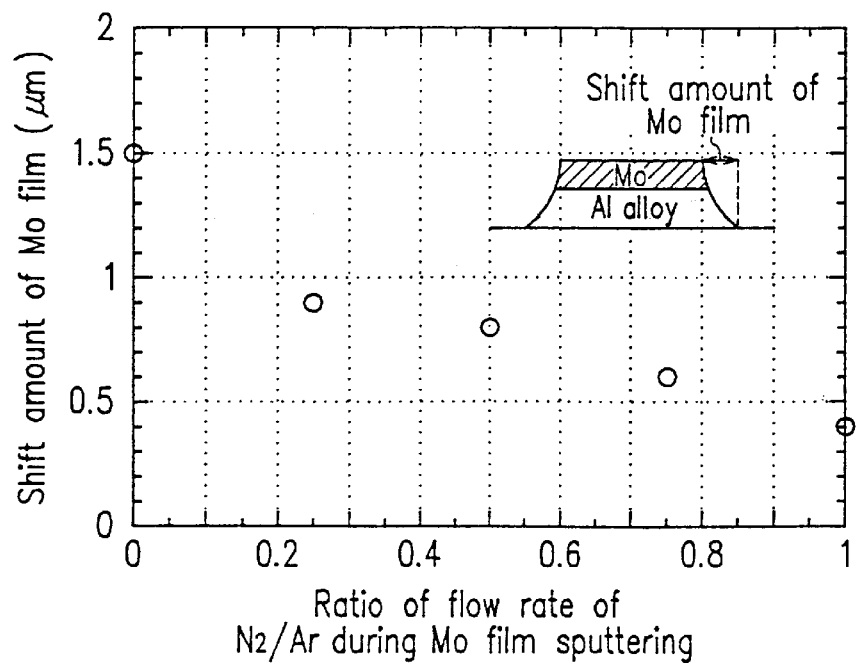
FIG. 8 is a graph showing the relationship between the ratio of flow rate of $N_2/Ar$ during an Mo film sputtering process and the amount of shift ($\mu$m) of the Mo film with respect to an Al film.

The x-axis of the graph shown in FIG. 8 represents the ratio of the flow rate of $N_2/Ar$ during the Mo film deposition, whereas the y-axis thereof represents one-half of the measured line width difference ($\mu$m) between the Al film and the Mo film on the Al film after a wet etching process, i.e., the amount of shift ($\mu$m) of the Mo film with respect to the Al film on one side. Herein, the thickness of the Al allay metal film is about 500 nm, whereas the thickness of the Mo film is about 150 nm. As can be seen from FIG. 8, as the ratio of the $N_2/Ar$ flow rate during the Mo film sputtering increases, the amount of shift of the Mo film with respect to the Al film decreases.

Japanese Laid-Open Patent Publication No. 6-104241 discloses a method for controlling the amount of shift of the Mo film of the Mo/Al double layer structure with respect to the Al film thereof by controlling the thickness ratio of the two films. On the other hand, the present invention controls the etching rates of the Mo film and the Al film (so that the two etching rates become closer to each other), which results in a larger process margin (i.e., the liberty in processes) as compared with the method above.

Figure 9:
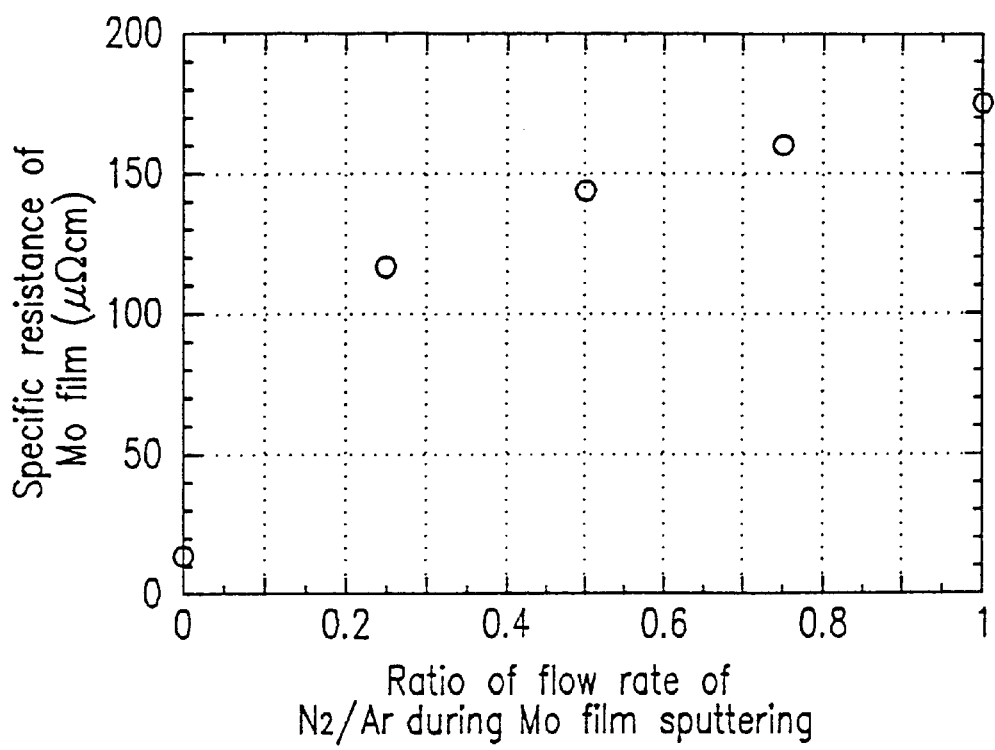
FIG. 9 is a graph showing the relationship between the ratio of flow rate of $N_2/Ar$ during an Mo film sputtering process and the specific resistance ($\mu\Omega$m) of the Mo film.

FIG. 9 is a graph showing the relationship between the $N_2$/Ar flow rate ratio during the Mo film sputtering (represented by the x-axis) and the specific resistance ($\mu\Omega$cm) of the Mo film (represented by the y-axis). As can be seen from FIG. 9, as the $N_2$/Ar flow rate ratio during the Mo film sputtering increases, the specific resistance of the Mo film also increases. However, since the source/drain lines have the Al/Mo double layer structure, and aluminum is a metal having a low resistance, the resistance of the source/drain lines as a whole remains low.

For example, when the Mo film is deposited in an atmosphere where the flow rate of Ar gas is about 20 sccm, and the flow rate of $N_2$ gas is about 10 sccm, the specific resistance of the Mo film becomes considerably high and reaches about 154 $\mu\Omega$cm. However, when the source/drain lines have the double layer structure of the thus grown Mo film and the Al film, assuming that the thickness of the Al film is about 150 nm and the thickness of the Al film is about 500 nm, the specific resistance of the entire double layer structure increases only by a modest percentage of about 10 to 15% as compared with that of a double layer structure of a normally-processed Mo film and an Al film.

Accordingly, by forming the source/drain electrode lines so as to have the double layer structure of the N-introduced Mo film and the Al film, it is possible to minimize the amount by which the Mo film shifts with respect to the Al film when the Mo film and the Al film are simultaneously etched. Therefore, it is possible to enhance the reliability of the source/drain electrode lines while suppressing a substantial increase in the resistance of the lines.

Hereinafter, the present invention will be described by way of illustrative examples with reference to the accompanying figures. However, it is not intended that the present invention be limited to the examples below. The figures used in conjunction with the description of the following examples are cross-sectional views schematically showing a TFT as a switching element which constitutes an essential part of a pixel of a liquid crystal display panel.

EXAMPLE 1

Figure 1:
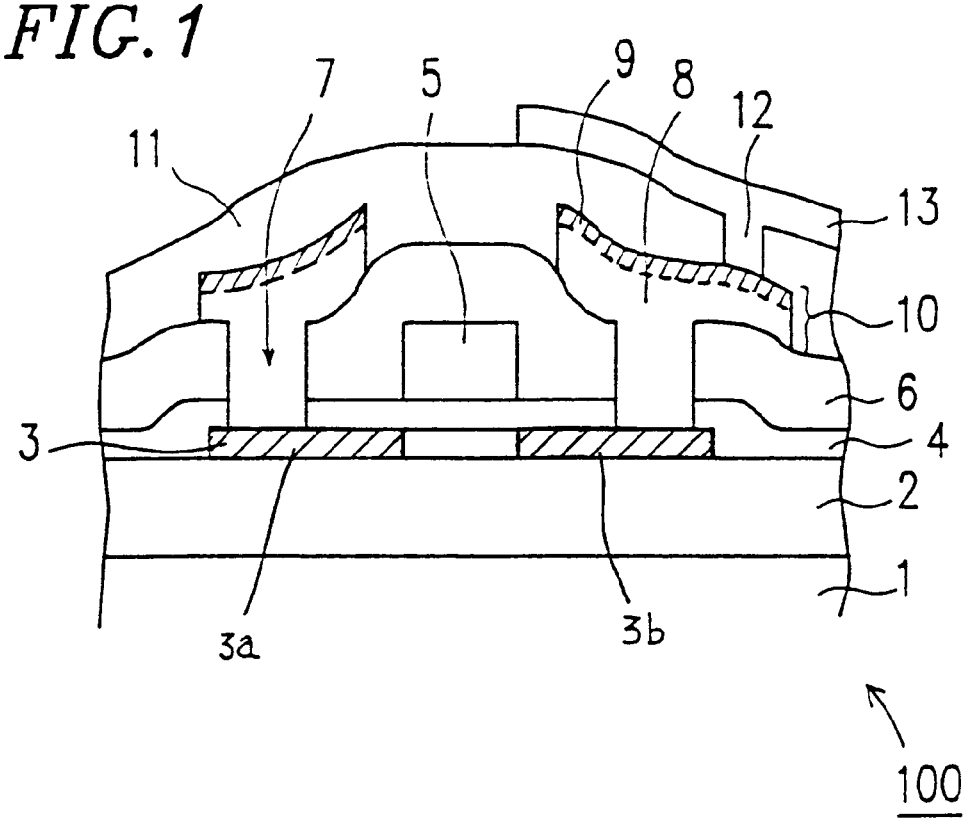
FIG. 1 is a cross-sectional view illustrating a configuration of a TFT according to Examples 1 to 4 of the present invention.

FIG. 1 is a cross-sectional view showing a configuration of a TFT according to Example 1 of the present invention. FIGS. 2A to 2C, 3A to 3C, 4A and 4B are cross-sectional views for illustrating a method for fabricating a TFT according to Example 1 of the present invention, each of the figures showing a cross section of the TFT after each process step for fabricating a TFT.

In FIG. 1, reference numeral 100 denotes a TFT according to Example 1 of the present invention. An $SiO_2$ layer 2 is provided on a glass substrate 1. A semiconductor layer 3 is provided on the $SiO_2$ layer 2. A gate electrode 5 is provided above a central area of the semiconductor layer 3 and a gate insulating film 4. End portions of the semiconductor layer 3 each form a source region 3a and a drain region 3b. The portions are laterally spaced apart from each other with a laterally central portion of the semiconductor layer 3 therebetween which is located directly below the gate electrode 5. The semiconductor layer 3 and the gate electrode 5 are covered with an interlayer insulating film 6. Contact holes 7 run through the interlayer insulating film 6 and correspond to the source and drain regions. Source/drain electrode lines 10 are provided on the interlayer insulating film 6, and are electrically connected to the source and drain regions via the contact holes 7.

The source/drain electrode lines 10 have a double layer structure of a lower layer 8 of an Al alloy metal film and an upper layer 9 of an N-containing Mo film. Surfaces of the source/drain electrode lines 10 and the interlayer insulating film 6 are covered with a surface protective layer 11. A pixel electrode 13 is provided on the surface protective layer 11. The pixel electrode 13 is electrically connected to the source/drain electrode lines 10 via a contact hole 12 running through the depth of the surface protective layer 11.

Hereinafter, a method for fabricating the TFT will be described.

As shown in FIG. 2A, an $SiO_2$ film 2 is deposited on the glass substrate 1 so as to be about 100 nm thick in order to prevent an impurity from scattering from the glass substrate 1. A silicon layer is further deposited on the $SiO_2$ film 2 so as to be about 50 nm thick, and is then processed to form the semiconductor layer 3.

Next, as shown in FIG. 2B, another $SiO_2$ film (which forms the gate insulating film 4) is deposited over the entire surface of the substrate. A metal having a low resistance and an excellent heat resistance is deposited on the gate insulating film 4 so as to correspond to a prescribed area of the semiconductor layer 3 located below the gate insulating film 4, and is then patterned to form the gate electrode 5.

Subsequently, as shown in FIG. 2C, $n^+$ ion implantation for forming the source region 3a and drain region 3b is performed using a mixed gas containing a $PH_3$ gas and an $H_2$ gas as an atmosphere under a condition where the acceleration voltage is 80 keV, and the dose is about 5E14/$cm^2$.

Then, the semiconductor layer 3 is activated by laser irradiation with an energy concentration of about 350 mj/$cm^2$ using a Xe—Cl excimer laser at room temperature in an air atmosphere, after which the interlayer insulating film 6 is deposited on the entire surface of the substrate. The contact holes 7 corresponding to the source and drain regions and another contact hole (not shown) corresponding to the gate electrode 5 are then provided (see FIG. 3A).

Next, as shown in FIG. 3B, the Al alloy metal film 8 is grown to be about 500 nm thick in an atmosphere where the flow rate of Ar gas is about 50 sccm and the gas pressure is about 3.0×$10^{-3}$ Torr. The Mo film 9 is grown on the Al film 8 to be about 150 nm thick in an atmosphere where the flow rate of Ar gas is about 20 sccm, the flow rate of $N_2$ gas is about 10 sccm, and the gas pressure is about 3.0×$10^{-3}$ Torr. The Al film 8 and the Mo film 9 are successively deposited by sputtering. Although the flow rate of $N_2$ gas is not limited to the value above, it is preferably about 10 to 70% of that of the Ar gas. The Al film and the Mo film are then patterned by wet etching to form the source/drain electrode lines 10.

The wet etching is performed by immersing the layers to be etched into a mixed solution containing phosphoric acid, nitric acid, acetic acid, and $H_2O$. Since both the Mo film and the Al film can be etched using this etching solution, these films can be etched simultaneously in the same etching bath, i.e., they can be etched in a single process step.

An Mo film sputtered in an atmosphere containing no $N_2$ gas has an etching rate higher than that of the Al film. Therefore, as the Al film is made thicker, the amount by which the Mo film is etched increases, thereby increasing the amount of shift of the Mo film with respect to the Al film.

On the other hand, according to the present invention, the Mo film which forms the Mo/Al double layer structure together with the Al film is deposited in an atmosphere containing an $N_2$ gas. Thus, it is possible to minimize the amount by which the Mo film shifts with respect to the Al film as a result of the wet etching process.

Other methods for forming an N-introduced Mo film include: ion-implanting a deposited Mo film with nitrogen under a condition where the flow rate of $N_2$ gas is about 10 sccm, the acceleration voltage is 80 keV, the RF power is about 180W, and the dose is about $1.8E15/cm^2$; and annealing a deposited Mo film in an atmosphere containing an $N_2$ gas. These methods are applicable to the fabrication process for the above-described TFT having the double-layered source/drain electrode lines.

Thus, the source/drain electrode lines 10 having the Mo/Al double layer structure is formed as shown in FIG. 3C with the amount by which the Mo film shifts with respect to the Al film as a result of the wet etching process being minimized.

Figure 4A:
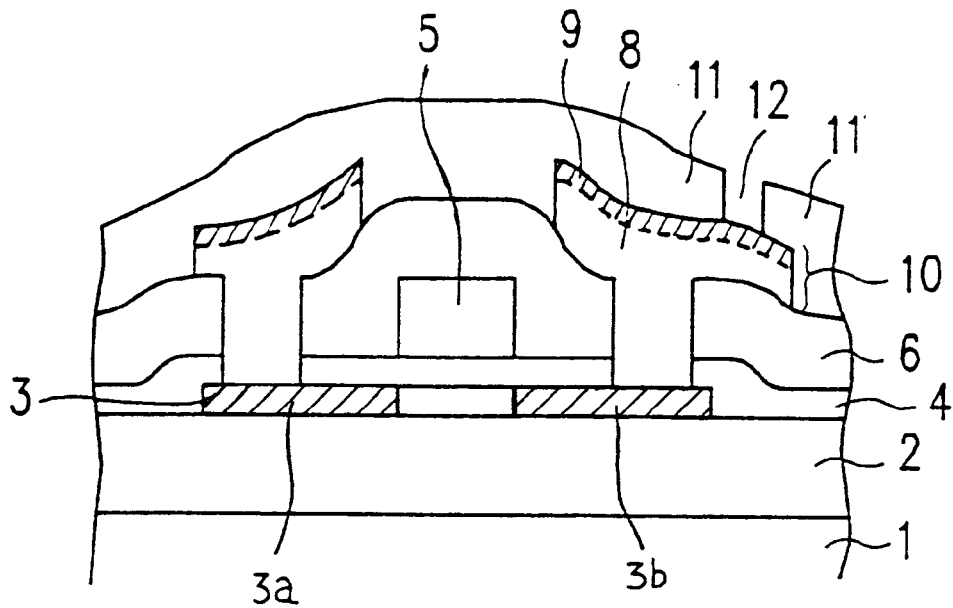

Then, as shown in FIG. 4A, the protective layer 11 is deposited over the entire surface of the substrate so as to cover the source/drain electrode lines 10, after which the contact hole 12 is provided through the depth of the protective layer 11 in order to obtain electric conductivity between the source/drain electrode lines 10 and subsequently formed the pixel electrode 13.

Figure 4B:
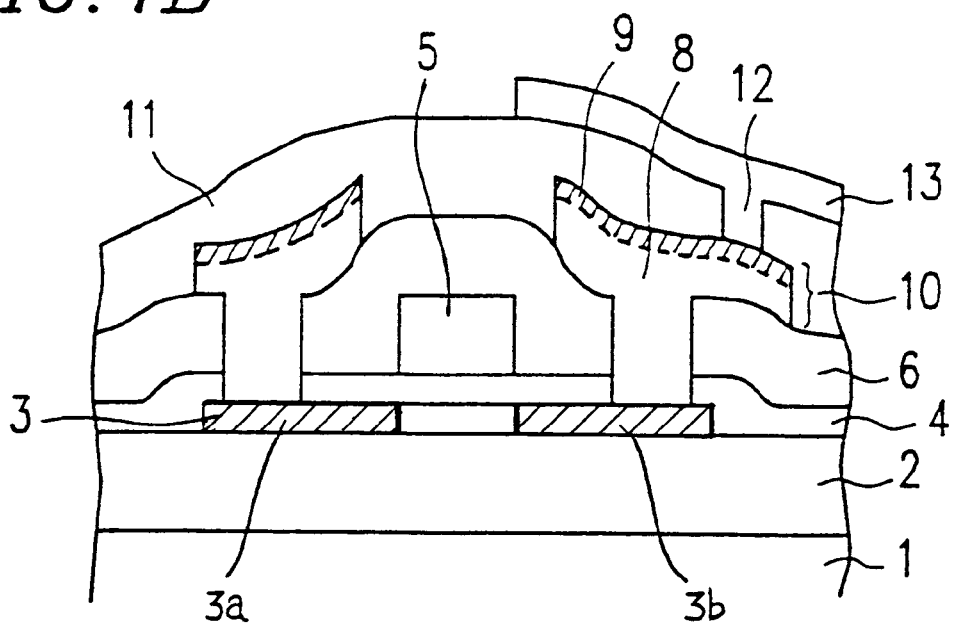
Figure 6A:
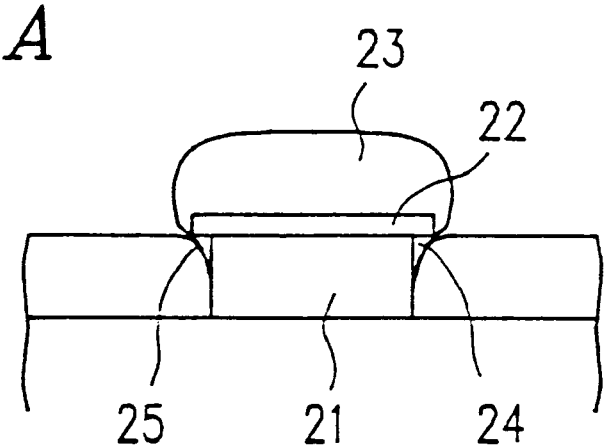
FIGS. 6A and 6B are views illustrating problems in a conventional double metal layer technique.
Figure 6B:
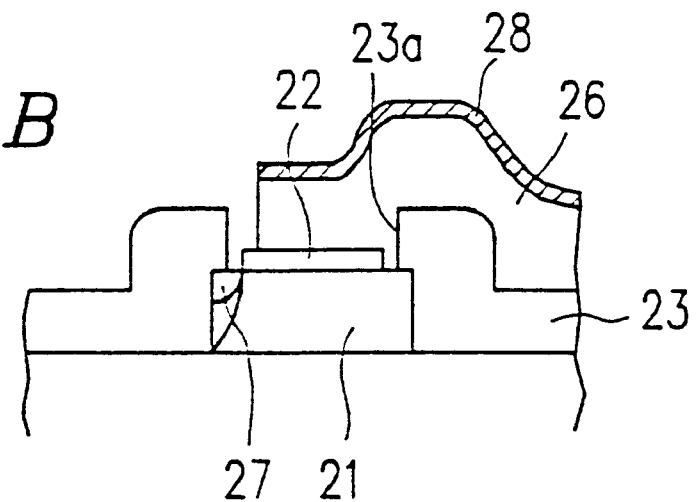

Finally, as shown in FIG. 4B, an ITO film is deposited on the protective layer 11 and then patterned to form the pixel electrode 13. Thus, the fabrication of the TFT 100 is completed.

EXAMPLE 2

Hereinafter, a TFT according to Example 2 of the present invention and the method for fabricating the same will be described.

In Example 2, the same processes as shown in FIGS. 2A to 2C and described in Example 1 are performed, and the contact holes 7 are provided through the interlayer insulating film 6 and the gate insulating film 4 as shown in FIG. 3A. Then, as shown in Figure 3B, the Al alloy metal film 8 is deposited on the interlayer insulating film 6 to be about 500 nm thick. The Mo film 9 is deposited on the Al film 8 to be about 150 nm thick by a CVD method under a condition where the flow rate of $MoF_6$ gas is about 70 sccm, the flow rate of $N_2$ gas is about 500 sccm, the gas pressure is about 30 Torr, and the process temperature is about 430° C., thus forming the N-containing Mo film 9. In this step, an $NH_3$ gas may be used in place of the $N_2$ gas.

Next, as shown in FIG. 3C, the Al film 8 and the Mo film 9 are patterned by wet etching, thereby forming the source/drain electrode lines 10 of the Mo/Al double layer structure with the amount of shift of the Mo film with respect to the Al film being minimized.

The subsequent steps to complete the fabrication of the TFT 100 (see FIG. 1) of Example 2 are the same as described in Example 1 and shown in FIGS. 4A and 4B.

EXAMPLE 3

Hereinafter, a TFT according to Example 3 of the present invention and the method for fabricating the same will be described.

In Example 3, the same process as shown in FIGS. 2A to 2C and described in Example 1 are performed, and the contact holes 7 are provided through of the interlayer insulating film 6 and the gate insulating film 4 as shown in FIG. 3A. Then, as shown in FIG. 3B, the Al alloy metal film 8 is grown on the interlayer insulating film 6 to be about 500 nm thick in an atmosphere where the flow rate of Ar gas is about 50 sccm, and the gas pressure is about 0.4 Pa. The Mo film 9 is grown on the Al film 8 to be about 150 nm thick in an atmosphere where the flow rate of Ar gas is about 50 sccm, and the gas pressure is about 0.4 Pa. In this step, the two layers are successively deposited by sputtering or the like.

The deposited Mo film is then subjected to a lamp annealing process for about two minutes under a condition where the flow rate of $N_2$ gas is about 1000 sccm, the gas pressure is about 10 Torr, and the process temperature is about 500° C. In this manner, nitrogen is introduced into the Mo film. In this step, an $NH_3$ gas may be used in place of the $N_2$, gas. Although the process temperature is not limited to 500° C., it is preferably in the range of about 450 to 600° C.

After the double layer structure of the N-containing Mo film and the Al film is thus formed as shown in FIG. 3B, the two layers are patterned by wet etching, thereby forming the source/drain electrode lines 10 of the Mo/Al double layer structure as shown in FIG. 3C with the amount of shift of the Mo film with respect to the Al film being minimized.

The subsequent steps to complete the fabrication of the TFT 100 (see FIG. 1) of Example 3 are the same as those described in Example 1 and shown in FIGS. 4A and 4B.

EXAMPLE 4

Hereinafter, a TFT according to Example 4 of the present invention and the method for fabricating the same will be described.

In Example 4, the same process as shown in FIGS. 2A to 2C and described in Example 1 are performed, and the contact holes 7 are provided through the interlayer insulating film 6 and the gate insulating film 4 as shown in FIG. 5A. Then, as shown in FIG. 5B, the Al film or Al alloy metal film 8 is deposited on the interlayer insulating film 6 to be about 500 nm thick in an atmosphere where the flow rate of Ar gas is about 50 sccm, and the gas pressure is about 0.4 Pa. An Mo film 14 is deposited on the Al film 8 to be about 150 nm thick in an atmosphere where the flow rate of Ar gas is about 50 sccm, and the gas pressure is about 0.4 Pa. In this step, the two layers are successively deposited by sputtering or the like.

Then, the deposited pure Mo film 14 containing only Mo is ion-implanted with nitrogen under a condition where the flow rate of $N_2$ gas is about 10 sccm, the acceleration voltage is 80 keV, the RF power is about 180W, and the dose is about $1.8E15/cm^2$ as shown in FIG. 5C. Nitrogen is thus introduced into the pure Mo film 14, thereby forming the N-containing Mo film 9.

After the double layer structure of the N-containing Mo film 9 and the Al film or the Al alloy metal film 8 is formed as shown in FIG. 5C, the two layers are patterned by wet etching, thereby forming the source/drain electrode lines 10 of the Mo/Al double layer structure as shown in FIG. 3C with the amount of shift of the Mo film with respect to the Al film being minimized.

The subsequent steps to complete the fabrication of the TFT 100 (see FIG. 1) of Example 4 are the same as described in Example 1 and shown in FIGS. 4A and 4B.

Although, any specific value of the specific resistance of the Mo film is not given in the above description, the specific resistance of the Mo film is set in the range of about 65 to 195 μΩcm in each of the above examples. Using the N-containing Mo film having a specific resistance in such a range, it is possible to minimize the amount by which the Mo film shifts with respect to the Al film as a result of the wet etching process.

Although, in the above examples, the source/drain electrode lines have the double layer structure where the Mo film is deposited on the Al film, the source/drain electrode lines may have the double layer structure where the Al film is deposited on the Mo film depending on particular applications. In this case again, by using the N-containing Mo film, it is possible to minimize the amount by which the Mo film shifts with respect to the Al film as a result of the wet etching process.

As discussed above, according to the present invention, the source/drain electrode lines on a substrate of an LCD on which a plurality of TFTs are arranged in a matrix have the double layer structure of the Al-containing metal film and the Mo film. Thus, it is possible to enhance the reliability of the source/drain electrode lines, thereby also increasing the production yield of the manufacturing process incorporating such TFTs.

Moreover, the Mo film is deposited in an atmosphere containing an $N_2$ gas. Thus, when the double-layered lines of the Al film and the Mo film are simultaneously patterned by wet etching, it is possible to perform a high-precision minute patterning process for the source/drain electrode lines with the amount of shift of the Mo film with respect to the Al film being minimized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a thin film transistor, comprising the step of forming a double-layered conductive layer of an Al-containing metal film and an N-containing Mo film, the conductive layer being connected to source and drain regions formed on an insulating base region, wherein the N-containing Mo film is deposited in an atmosphere containing an $N_2$ gas or an $NH_3$ gas.

2. A method for fabricating a thin film transistor, comprising the step of forming a double-layered conductive layer of an Al-containing metal film and an N-containing Mo film, the conductive layer being connected to source and drain regions formed on an insulating base region, wherein the N-containing Mo film is deposited by sputtering in an atmosphere containing a mixed gas of an Ar gas and an $N_2$ gas.

3. A method for fabricating a thin film transistor, comprising the step of forming a double-layered conductive layer of an Al-containing metal film and an N-containing Mo film, the conductive layer being connected to source and drain regions formed on an insulating base region, wherein the N-containing Mo film is deposited by a CVD method using a gas containing $N_2$ or $NH_3$.

4. A method for fabricating a thin film transistor, comprising the step of forming a double-layered conductive layer of an Al-containing metal film and an N-containing Mo film, the conductive layer being connected to source and drain regions formed on an insulating base region, wherein the N-containing Mo film is formed by introducing nitrogen into a film formed by a Mo deposition.

5. A method for fabricating a thin film transistor, comprising the step of forming a double-layered conductive layer of an Al-containing metal film and an N-containing Mo film, the conductive layer being connected to source and drain regions formed on an insulating base region, wherein the N-containing Mo film is formed by annealing a film formed by an Mo deposition in an atmosphere containing an $N_2$ gas or an $NH_3$ gas.

6. A method for fabricating a thin film transistor, comprising the step of forming a double-layered conductive layer of an Al-containing metal film and an N-containing Mo film, the conductive layer being connected to source and drain regions formed on an insulating base region, wherein the N-containing Mo film is formed by an ion implantation into a film formed by an Mo deposition.

7. A method of fabricating a double-layer conductive structure, comprising the steps of:

forming an Al-containing conductive layer, forming an N-containing Mo layer coupled to the Al-containing conductive layer, and etching the Al-containing conductive layer and the N-containing Mo layer, wherein an etch rate of the Al-containing conductive layer and the N-containing Mo layer are substantially the same.

8. A method for fabricating a thin film transistor according to claim 2, wherein a flow rate of the $N_2$ gas is about 10 to 70% of a flow rate of the Ar gas.

9. A method for fabricating a thin film transistor according to claim 2, further comprising the step of:

simultaneously etching the Mo film and the Al-containing metal film in the same etching bath.

10. A method for fabricating a thin film transistor according to claim 3, further comprising the step of:

simultaneously etching the Mo film and the Al-containing metal film in the same etching bath.

11. A method for fabricating a thin film transistor according to claim 5, further comprising the step of:

simultaneously etching the Mo film and the Al-containing metal film in the same etching bath.

12. A method for fabricating a thin film transistor according to claim 6, further comprising the step of:

simultaneously etching the Mo film and the Al-containing metal film in the same etching bath.

13. A method of fabricating a double-layer conductive structure according to claim 7, wherein the step of forming the N-containing Mo film is performed prior to the step of etching the Al-containing conductive layer and the N-containing Mo layer.

14. A method for fabricating a thin-film transistor, comprising:

forming a semiconductor layer on an insulating base region;

forming a gate electrode which is insulated from a portion of said semiconductor layer;

forming source and drain regions in said semiconductor layer, said source and drain regions being spaced apart by said portion of said semiconductor layer from which said gate electrode is insulated;

forming an interlayer insulating film which covers said gate electrode and said source and drain regions;

forming a double-layered conductive layer in contact with said source and drain regions via contact holes formed in said interlayer insulating film, the double-layered conductive layer being constituted by an aluminum-containing conductive film and a nitrogen-containing molybdenum film; and patterning said aluminum-containing conductive film and said nitrogen-containing molybdenum film of said double-layered conductive layer in a single etching processing step to form source/drain electrodes.

15. A method for fabricating a thin-film transistor according to claim 14, wherein said aluminum-containing conductive film and said nitrogen-containing molybdenum film are patterned by etching in the same etching bath.

16. A method for fabricating a thin-film transistor according to claim 14, wherein said nitrogen-containing molybdenum film is formed by sputtering in an atmosphere containing a mixture of an Ar gas and an $N_2$ gas.

17. A method for fabricating a thin-film transistor according to claim 14, wherein said nitrogen-containing molybdenum film is deposited by a chemical vapor deposition method using a gas containing $N_2$ or $NH_3$.

18. A method for fabricating a thin-film transistor according to claim 14, wherein said nitrogen-containing molybdenum film is formed by annealing a film formed by a molybdenum deposition in an atmosphere containing an $N_2$ gas or an $NH_3$ gas.

19. A method for fabricating a thin-film transistor according to claim 14, wherein said N-containing molybdenum film is formed by an ion implantation into a film formed by a molybdenum deposition.

* * * * *